US009618806B2

(12) United States Patent
Hwang et al.

(10) Patent No.: US 9,618,806 B2
(45) Date of Patent: Apr. 11, 2017

(54) DISPLAY DEVICE HAVING A MULTI-PORTION LIGHT BLOCKING MEMBER

(71) Applicant: Samsung Display Co., Ltd., Yongin-si, Gyeonggi-do (KR)

(72) Inventors: In-Jae Hwang, Suwon-si (KR); Mee Hye Jung, Suwon-si (KR); Hyun Joon Kim, Yongin-si (KR); Il Gon Kim, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/946,620

(22) Filed: Nov. 19, 2015

(65) Prior Publication Data

US 2016/0147122 A1 May 26, 2016

(30) Foreign Application Priority Data

Nov. 26, 2014 (KR) .......................... 10-2014-0166436

(51) Int. Cl.
| | |
|---|---|
| *H01L 27/32* | (2006.01) |
| *G02F 1/13* | (2006.01) |
| *G02F 1/1343* | (2006.01) |
| *G02F 1/1362* | (2006.01) |
| *G02F 1/1335* | (2006.01) |

(52) U.S. Cl.
CPC .. *G02F 1/134309* (2013.01); *G02F 1/133512* (2013.01); *G02F 1/136286* (2013.01); *H01L 27/3211* (2013.01)

(58) Field of Classification Search
CPC .......... H01L 27/3211; G02F 1/134309; G02F 1/133512; G02F 1/136286
See application file for complete search history.

(56) References Cited

U.S. PATENT DOCUMENTS 8,446,538 B2 * 5/2013 Kim ...................... G02F 1/1368
349/139
8,553,183 B2 * 10/2013 Kim .................. G02F 1/133514
349/106

(Continued)

FOREIGN PATENT DOCUMENTS

| JP | 5301895 | 6/2013 |
|---|---|---|
| KR | 10-2004-0084457 | 10/2004 |

(Continued)

*Primary Examiner* — Ida M Soward
(74) *Attorney, Agent, or Firm* — Innovation Counsel LLP

(57) ABSTRACT

A display device may include a transistor, which includes a first transistor electrode and a second transistor electrode. The display device may further include a pixel electrode, which is electrically connected to the second transistor electrode. The display device may further include a data line, which is electrically connected to the first transistor electrode, wherein the data line includes a bent structure. The display device may further include a light blocking member, which includes a light blocking portion, wherein the light blocking portion extends perpendicular to a section of the data line, and wherein the light blocking portion overlaps both the transistor and the bent structure without overlapping the section of the data line in a direction perpendicular to the light blocking member.

20 Claims, 11 Drawing Sheets

(56) References Cited

U.S. PATENT DOCUMENTS

| | | | | |
|---|---|---|---|---|
| 8,717,344 B2* | 5/2014 | Han | | G09G 3/3614 345/204 |
| 8,755,013 B2* | 6/2014 | Kye | | G02F 1/133711 156/272.2 |
| 8,804,083 B2* | 8/2014 | Park | | G02F 1/134336 349/143 |
| 9,030,395 B2* | 5/2015 | Cho | | G09G 3/3648 345/92 |
| 9,217,858 B2* | 12/2015 | Hwang | | G02F 1/167 |
| 2010/0167206 A1* | 7/2010 | Jeon | | G02F 1/13439 430/281.1 |
| 2011/0109852 A1* | 5/2011 | Kim | | G02F 1/133514 349/108 |
| 2011/0170032 A1* | 7/2011 | Song | | G02F 1/133707 349/48 |
| 2011/0170045 A1* | 7/2011 | Lee | | G02F 1/136259 349/144 |
| 2011/0261307 A1* | 10/2011 | Shin | | G02F 1/133753 349/123 |
| 2012/0218501 A1* | 8/2012 | Lee | | G02F 1/134309 349/139 |
| 2013/0188116 A1* | 7/2013 | Jeon | | G02F 1/133512 349/106 |
| 2013/0229609 A1* | 9/2013 | Jeong | | G02F 1/133707 349/138 |
| 2013/0293820 A1* | 11/2013 | Lee | | G02F 1/134336 349/143 |
| 2013/0329162 A1 | 12/2013 | Fujii et al. | | |
| 2015/0116625 A1 | 4/2015 | Hwang et al. | | |
| 2015/0185541 A1* | 7/2015 | Lee | | G02F 1/133345 349/48 |

FOREIGN PATENT DOCUMENTS

| | | |
|---|---|---|
| KR | 10-2007-0015805 | 2/2007 |
| KR | 10-2015-0047399 | 5/2015 |

* cited by examiner

DISPLAY DEVICE HAVING A MULTI-PORTION LIGHT BLOCKING MEMBER

CROSS-REFERENCE TO RELATED APPLICATION

This application claims priority to and the benefit of Korean Patent Application No. 10-2014-0166436 filed in the Korean Intellectual Property Office on Nov. 26, 2014; the entire contents of the Korean Patent Application are incorporated herein by reference.

BACKGROUND (a) Field

The present invention relates to a display device, such as a liquid crystal display device.

(b) Description of the Related Art

A display device, such as a liquid crystal display, may include two panels with field generating electrodes (such as a pixel electrode and a common electrode) and may include a liquid crystal layer interposed between the two panels. The liquid crystal display may generate an electric field in the liquid crystal layer by applying a voltage to the field generating electrodes, to determine orientations of liquid crystal molecules of the liquid crystal layer, such that images displayed by the liquid crystal display may be controlled.

In a liquid crystal display, in order to implement a wide viewing angle, a pixel may include a plurality of domains having different liquid crystal molecule alignment directions.

The above information disclosed in this Background section is for enhancement of understanding of the background of the invention. The Background section may contain information that does not form the prior art that is already known in this country to a person of ordinary skill in the art.

SUMMARY

Embodiments of present invention may be related to a display device that may include bent structures of data lines, a reduced width of a horizontal light blocking portion, different widths of vertical light blocking portions, and/or substantial identical branch electrode structures for different-colored pixels in a same unit pixel. The display device may have a satisfactory aperture ratio and/or may display images with satisfactory quality and without conspicuous unwanted texture.

An embodiment of the present invention may be related to a display device, such as a liquid crystal display device. The display device may include a first transistor, which may include a first transistor electrode and a second transistor electrode. The display device may further include a first pixel electrode, which may be electrically connected to the second transistor electrode. The display device may further include a first data line, which may be electrically connected to the first transistor electrode. The first data line may include a first bent structure. The display device may further include a light blocking member, which may include a first light blocking portion. The first light blocking portion may extend perpendicular to a section of the first data line. The first light blocking portion may overlap both the first transistor and the first bent structure without overlapping the section of the first data line in a direction perpendicular to the light blocking member.

The display device may include a second data line. The light blocking member may include a second light blocking portion, which may extend parallel to the section of the first data line and may overlap the second data line. The light blocking member may include a third light blocking portion, which may extend parallel to the section of the first data line and may be connected to the second light blocking portion through the first light blocking portion. The second light blocking portion may be wider than the third light blocking portion in a direction perpendicular to the section of the first data line. The first bent structure may protrude toward the second data line.

The display device may include a second transistor. A portion of the second transistor may directly contact a first portion of the first pixel electrode. The portion of the second transistor may overlap the second light blocking portion without overlapping the first light blocking portion in the direction perpendicular to the light blocking member.

The display device may include a third transistor. A portion of the third transistor may directly contact a second portion of the first pixel electrode. The portion of the third transistor may overlap the second light blocking portion without overlapping the first light blocking portion in the direction perpendicular to the light blocking member. The first light blocking portion may be positioned between the portion of the second transistor and the portion of the third transistor in a layout view of the display device.

A width of the second light blocking portion may be at least two times a width of the third light blocking portion.

The display device may include a second data line, which may extend parallel to the section of the first data line. The display device may include a third data line, which may be positioned between the first data line and the second data line. The third data line may include a second bent structure. The first light blocking portion may overlap the second bent structure.

The second bent structure may protrude more significantly than the first bent structure.

Each of the first bent structure and the second bent structure may protrude toward the second data line.

The display device may include a second pixel electrode, which may be spaced from the first pixel electrode. The first bent structure may be not positioned between two subpixel electrodes of any pixel electrode of the display device in a layout view of the display device. A portion of the second bent structure may be positioned between a first subpixel electrode of the second pixel electrode and a second subpixel electrode of the second pixel electrode in the layout view of the display device.

A portion of the first bent structure may be positioned between a first subpixel electrode of the first pixel electrode and a second subpixel electrode of the first pixel electrode in a layout view of the display device.

The display device may include a second pixel electrode, which may neighbor the first pixel electrode without any pixel electrode being positioned between the first pixel electrode and the second pixel electrode. The display device may further include a third pixel electrode, which may neighbor the second pixel electrode with no pixel electrode being positioned between the second pixel electrode and the third pixel electrode. The display device may further include a first-color color filter, which may overlap the first pixel electrode. The display device may further include a second-color color filter, which may overlap the second pixel electrode. The display device may further include a third-color color filter, which may overlap the third pixel electrode. A width of the first pixel electrode may be equal to each of a width of the second pixel electrode and a width of the third pixel electrode.

A branch electrode structure of the first pixel electrode may be identical to each of a branch electrode structure of the second pixel electrode and a branch electrode structure of the third pixel electrode.

Each of the branch electrode structure of the first pixel electrode, the branch electrode structure of the second pixel electrode, and the branch electrode structure of the third pixel electrode may include a "<" shaped structure and a ">" shaped structure that may be connected to each other in a direction parallel to the section of the first data line.

The first data line may include a first data line section, a second data line section, and a third data line section. The first bent structure may include the first data line section and the third data line section. The section of the first data line may be the second data line section. The first data line section may be not aligned with the second data line section. The first data line section may be connected through the third data line section to the second data line section. The first light blocking portion may overlap the first data line section without overlapping the second data line section in the direction perpendicular to the light blocking member.

Each of the first data line section, the second data line section, and the third data line section may be substantially straight.

The third data line section may extend at an obtuse angle with respect to the first data line section.

The second data line section may extend in a direction parallel to the first data line section.

The display device may include a second data line. The light blocking member may further include a second light blocking portion, which may extend parallel to the second data line section and may overlap the second data line. The light blocking member may further include a third light blocking portion, which may extend parallel to the second data line section and may be connected to the second light blocking portion through the first light blocking portion. The second light blocking portion may be wider than the third light blocking portion in a direction perpendicular to the second data line section. The first data line section may be positioned closer to the second data line than the second data line section.

The display device may include a third data line, which may be positioned between the first data line and the second data line. The third data line may include a fourth data line section, a fifth data line section, and a sixth data line section. The fourth data line section may not be aligned with the fifth data line section. The fourth data line section may be connected through the sixth data line section to the fifth data line section. The first light blocking portion may overlap the fourth data line section without overlapping the fifth data line section in the direction perpendicular to the light blocking member.

The sixth data line section may be longer than the third data line section.

Each of the fourth data line section, the fifth data line section, and the sixth data line section may be substantially straight.

An obtuse angle formed between the fourth data line section and the sixth data line section may be smaller than an obtuse angle formed between the first data line section and the third data line section.

The fourth data line section may be shorter than the first data line section.

The first light blocking portion may overlap the sixth data line section without overlapping the third data line section.

An liquid crystal display according to an embodiment of the present invention may include the following elements: a first substrate; a plurality of data lines formed on the first substrate; an insulating layer formed on the data lines; and a plurality of pixel electrodes formed on the insulating layer, each pixel electrode of the pixel electrodes including a first subpixel electrode and a second subpixel electrode, wherein a first pixel electrode, a second pixel electrode, and a third pixel electrode among the plurality of pixel electrodes form one unit pixel, a distance between the first pixel electrode and the second pixel electrode and a distance between the second pixel electrode and the third pixel electrode are narrower than a distance between the third pixel electrode and an immediately neighboring unit pixel, and a data line connected to at least one of the second pixel electrode and the third pixel electrode may have a bent structure in a region extending between the first subpixel electrode and the second subpixel electrode of the second pixel electrode in a layout view of the liquid crystal display.

A light blocking member may include light blocking portions that are positioned between the first pixel electrode and the second pixel electrode, between the second pixel electrode and the third pixel electrode, between the third pixel electrode and the immediately neighboring unit pixel, and between the first pixel electrode and the second subpixel electrode of the second pixel electrode in the layout view of the liquid crystal display.

The width of a light blocking portion positioned between the third pixel electrode and a first pixel electrode of the immediately neighboring unit pixel may be two times or more the width of the light blocking portion positioned between the first pixel electrode and the second pixel electrode and the width of the light blocking portion positioned between the second pixel electrode and the third pixel electrode.

The liquid crystal display may include the following elements: a second substrate overlapping the first substrate; color filters formed on the second substrate; and a liquid crystal layer provided between the first substrate and the second substrate.

A color filter formed in an area corresponding to the first pixel electrode may be a red color filter, a color filter formed in an area corresponding to the second pixel electrode may be a green color filter, and a color filter formed in an area corresponding to the third pixel electrode may be a blue color filter.

The first pixel electrode, the second pixel electrode, and the third pixel electrode may have the same width.

Each of the first subpixel electrode and the second subpixel electrode may include the following elements: a first horizontal stem and a second horizontal stem respectively extending in a horizontal direction; a first vertical stem formed in one end of the first horizontal stem and perpendicularly crossing the first horizontal stem and a second vertical stem formed in one end of the second horizontal stem and perpendicularly crossing the second horizontal stem; and a plurality of minute branches extended in a diagonal/oblique direction from lateral ends of each of the horizontal stems.

The vertical stems may be alternately formed at edges of pixels in the first subpixel electrode and the second subpixel electrode.

The first pixel electrode, the second pixel electrode, and the third pixel may have the same alignment shape of the vertical stem.

Alignment direction arrangements of liquid crystals in areas respectively corresponding to the first pixel electrode, the second pixel electrode, and the third pixel electrode may be substantially identical to each other.

Alignment direction arrangements of liquid crystal molecules of two immediately adjacent/neighboring unit pixels may be opposite to each other.

A plurality of source and drain electrodes, branched from the data lines, may be provided in an area between the first subpixel electrodes and the second subpixel electrodes of the first pixel electrode, the second pixel electrode, and third pixel electrode. The first subpixel electrodes and the second subpixel electrodes of the first pixel electrode, the second pixel electrode, and third pixel electrode may be connected with the drain electrodes.

A distance between the data line positioned closest to the first pixel electrode and the data line positioned closest to the second pixel electrode may be greater than a width of the first pixel electrode in an area where a source electrode and a drain electrode are located.

A distance between the data line positioned closest to the second pixel electrode and the data line closest to the third pixel electrode may be greater than a width of the second pixel electrode in an area where a source electrode and a drain electrode are located.

A distance between the data line positioned closest to the third pixel electrode and a data line positioned closest to the first pixel electrode of the immediately adjacent unit pixel may be greater than a width of the third pixel electrode in an area where a source electrode and a drain electrode are located.

A voltage applied to the first subpixel electrode of a pixel electrode and a voltage applied to the second subpixel electrode of the pixel electrode may be different from each other.

A data line connected to the second pixel electrode and the third pixel electrode may have a bent structure in the shape of a reverse "C" in an area between the first subpixel electrode and the second subpixel electrode of the second pixel electrode or the third pixel electrode.

According to embodiments of the present invention, liquid crystal molecules in three consecutive pixels of a unit pixel may be aligned according to the same direction arrangement, and the light blocking portion positioned at a boundary of two immediately neighboring unit pixels may have a sufficient width. Advantageously, unwanted reverse directional texture in displayed images may be minimized or prevented, such that satisfactory image display quality may be provided. According to embodiments of the present invention, bent structures of data lines may enable reduction of widths of light-blocked transistor regions. Advantageously, a satisfactory aperture ratio may be implemented, such that satisfactory image display quality may be provided.

DETAILED DESCRIPTION OF EMBODIMENTS

Figure 1:
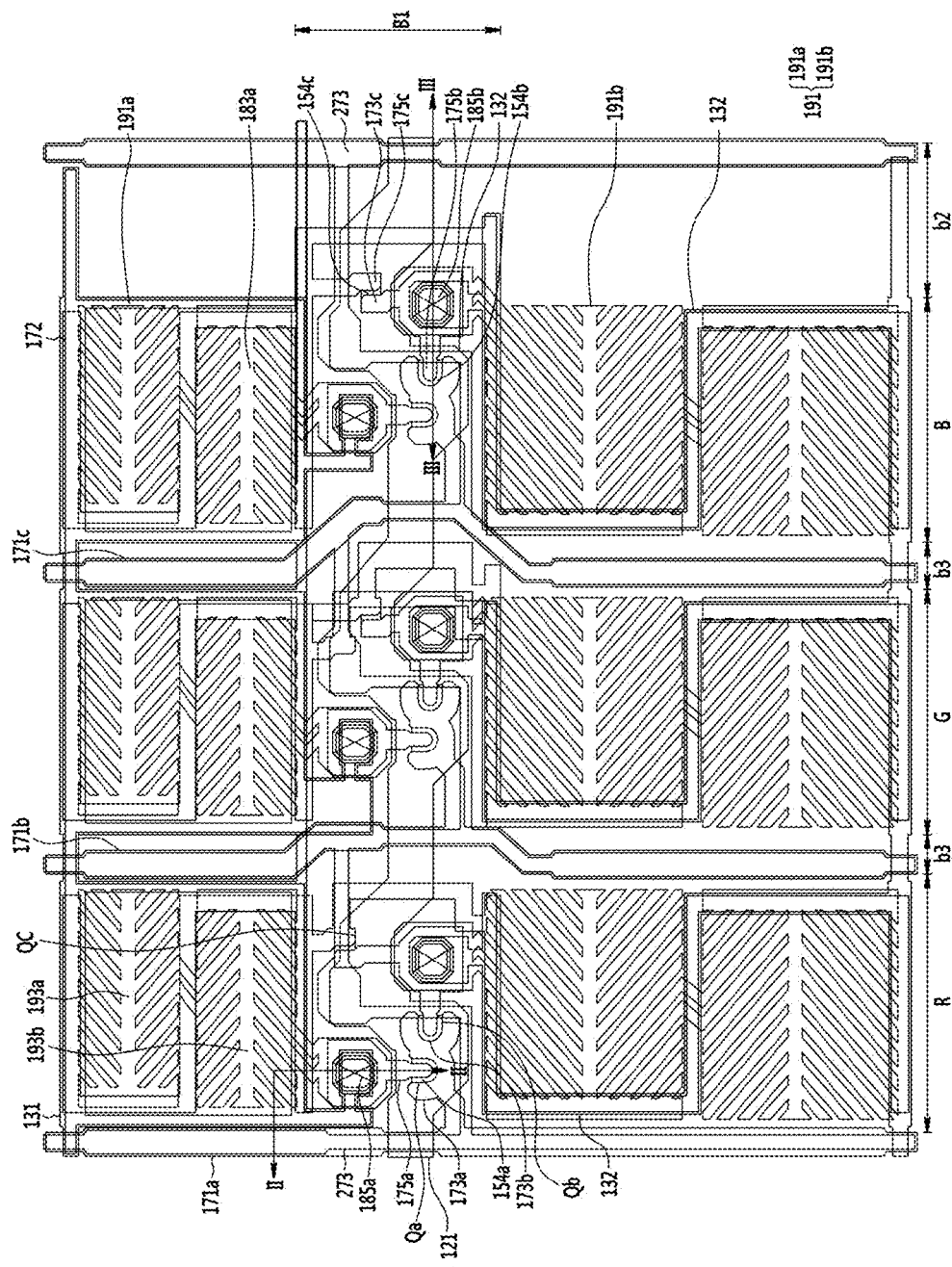
FIG. 1 is a schematic layout view illustrating a thin film transistor array panel of a display device according to an embodiment of the present invention.

Embodiments of the present invention are described with reference to the accompanying drawings. As those skilled in the art would realize, the described embodiments may be modified in various different ways, all without departing from the spirit or scope of the present invention.

In the drawings, the thicknesses of layers, films, panels, regions, etc., may be exaggerated for clarity. Like reference numerals may designate like elements in the specification. When a first element (such as a layer, film, region, or substrate) is referred to as being "on" a second element, the first element can be directly on the second element, or one or more intervening elements may also be present. In contrast, when a first element is referred to as being "directly on" a second element, there are no intended intervening elements between the first element and the second element.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the description, the term "connect" may mean "electrically connect"; the term "insulate" may mean "electrically insulate".

Figure 2:
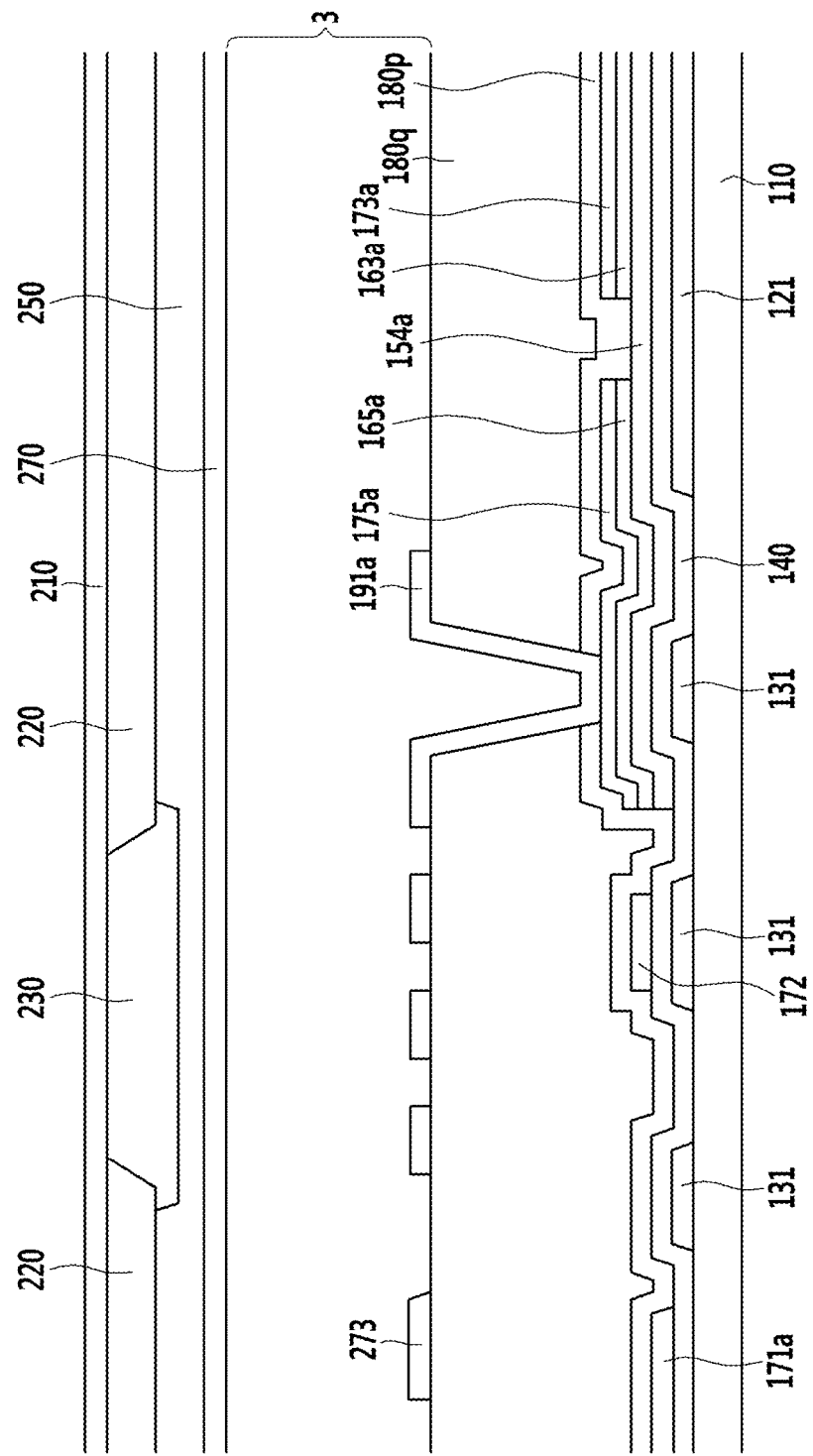
FIG. 2 is a schematic cross-sectional view of the display device taken along the line II-II indicated in FIG. 1 according to an embodiment of the present invention.
Figure 3:
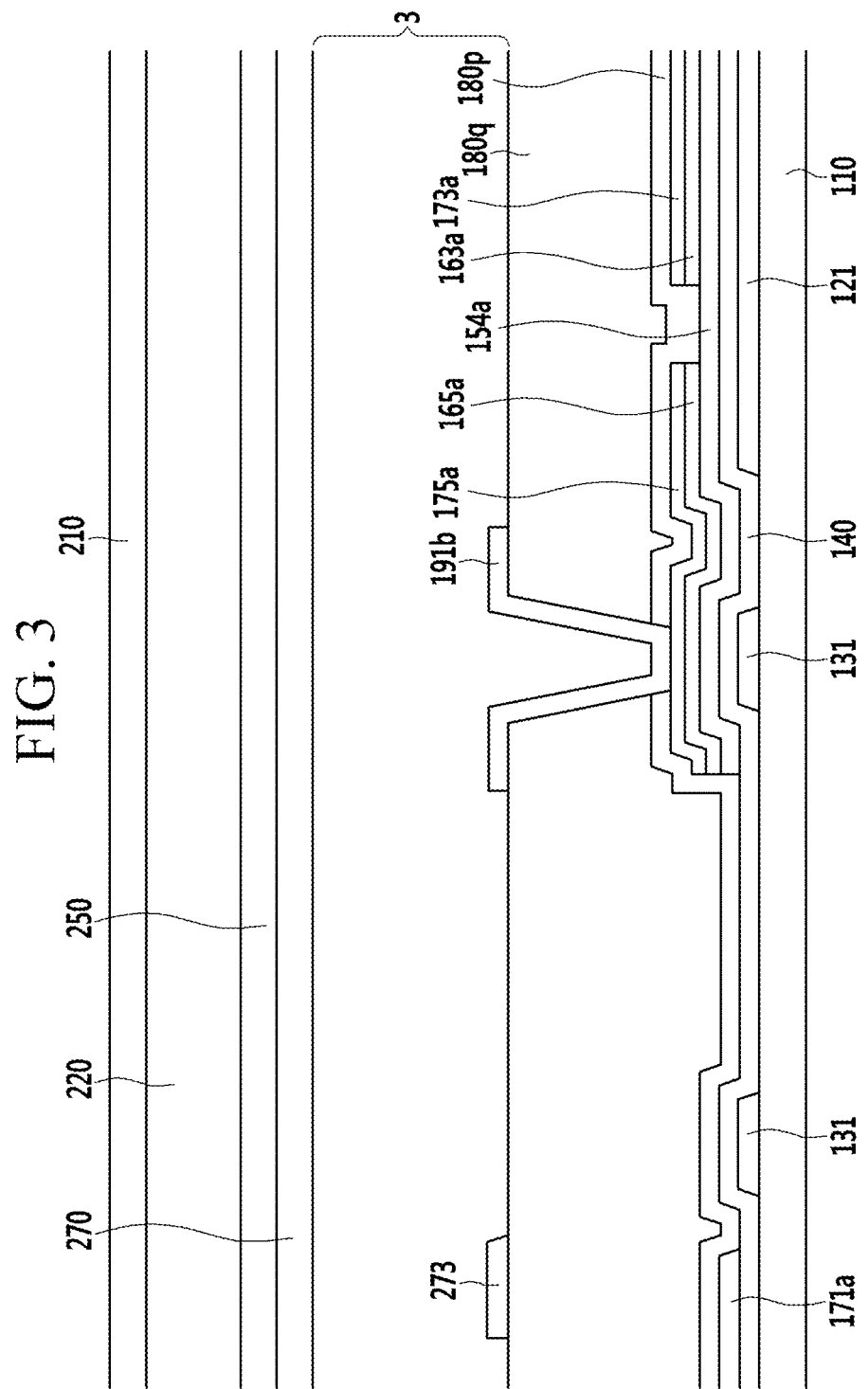
FIG. 3 is a schematic cross-sectional view of the display device taken along the line III-III indicated FIG. 1 according to an embodiment of the present invention.

FIG. 1 is a schematic layout view illustrating a thin film transistor array panel of a display device according to an embodiment of the present invention. FIG. 2 is a schematic cross-sectional view of the display device taken along the line II-II indicated in FIG. 1 according to an embodiment of the present invention. FIG. 3 is a schematic cross-sectional view of the display device taken along the line III-III indicated FIG. 1 according to an embodiment of the present invention.

FIG. 1 illustrates three adjacent (or consecutive) pixels, and the left, middle, and right pixels illustrated in FIG. 1 may respectively represent red, green, and blue pixels, which may be respectively associated with red, green, and blue color filters. In the description, pixels respectively having or corresponding to a red color filter, a green color filter, and a blue color filter may be respectively referred to as a red pixel R, a green pixel G, and a blue pixel B. The order and/or arrangement of color filters and associated pixels may be changed and/or configured according embodiments.

Referring to FIG. 1, FIG. 2, and FIG. 3, the display may include a first subpixel electrode 191a and a second subpixel electrode 191b for each of the pixels R, G, and B; the display device may include light blocking member 220, e.g., a black matrix. The light blocking member 220 may include light blocking portions that overlap areas positioned between the subpixel electrodes. The light blocking member 220 may include a first light blocking portion, a second light blocking portion, a third light blocking portion, and a fourth light blocking portion.

The first light blocking portion may be a horizontal blocking portion when the display device is in a standing/mounted position, in a ready-to-use position, and/or is in use. The first light blocking portion may overlap transistors and may overlap edges of subpixel electrodes 191a and 191b (of one or more of the pixels R, G, and B). A width of the light blocking first portion (in a direction substantially parallel to a data line 171a of the display device) may be represented by B1.

The second light blocking portion, the third light blocking portion, and the fourth light blocking portion may be vertical light blocking portions when the display device is in a standing/mounted position, in a ready-to-use position, and/or is in use. The first light blocking portion may be positioned and (directly) connected between two sections of each of the second, third, and fourth light blocking portions.

The second light blocking portion may overlap a data line 171, which may be associated with the next unit pixel. The subpixel electrodes 191a and 191b of the blue pixel B may be positioned between the second light blocking portion and the third light blocking portion in a layout view (or top view) of the display device. A width of the second light blocking portion (in a direction substantially perpendicular to the to a data line 171a of the display device) may be represented by b2.

The third light blocking portion may be positioned between the subpixel electrode 191a of the blue pixel B and the subpixel electrode 191a of the green pixel G (and/or between the subpixel electrode 191b of the blue pixel B and the subpixel electrode 191b of the green pixel G) in the layout view (or top view) of the display device. A width of the third light blocking light blocking portion (in the direction substantially perpendicular to the to a data line 171a of the display device) may be represented by b3, which may be less (i.e., narrower) than b2.

The fourth light blocking portion may be positioned between the subpixel electrode 191a of the green pixel G and the subpixel electrode 191a of the red pixel R (and/or between the subpixel electrode 191b of the green pixel G and the subpixel electrode 191b of the red pixel R) in the layout view (or top view) of the display device. A width of the fourth light blocking portion (in the direction substantially perpendicular to the to a data line 171a of the display device) may be substantially equal to the width of the third light blocking portion and may be represented by b3, which may be less (i.e., narrower) than b2.

The display device may include data lines 171a, 171b, and 171c. Data lines 171b and 171c may overlap the third light blocking portion and the fourth light blocking portion. Each of data line portions of data lines 171b and 171c that overlap the first light blocking portion may have a bent structure, which may include two sections oriented (and/or extending) at an obtuse angle with respect to each other. The bent structure may enable minimization of the width B1, for enhancing image display quality.

The display device may include a gate conductor that may include a gate line 121 and storage electrode lines 131 and 132. The gate conductor may be formed on an insulation substrate 110 made of transparent glass or plastic.

The gate line 121 may include a wide end portion for contacting a gate electrode, another layer, and/or an external driving circuit. The gate line 121 may be made of one or more of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). The gate line 121 may have a single-layer structure or a multilayer structure, which may include at least two conductive layers having different physical properties.

The gate line 121 may substantially horizontally extend between the subpixel electrode 191a and the subpixel 191b of each of the pixels R, G, and B (in a directly perpendicular to the to the data line 171a). An upper area, or a first subpixel area, which is associated with a subpixel electrode 191a may be configured to display a high gray; a lower area, or a second subpixel area, which is associated with a subpixel electrode 191b may be configured to display a low gray.

The storage electrode lines 131 and 132 may be made of the same material(s) as the gate line 121 and may be simultaneously formed with the gate line 121

The storage electrode line 131 may include sections that may form a quadrangular shape and may surround a substantial portion of a subpixel electrode 191a in the layout view of the display device. The uppermost side of the storage electrode line 131 may extend substantially horizontally and may be connected to another layer or to an external driving circuit.

The storage electrode line 132 may overlap a subpixel electrode 191b and may have a shape that is substantially similar to the shape of the number "5" or the number "2" shown in a seven-segment digital display. The storage electrode line 132 may include first, second, and third horizontal portions and may include first and second vertical portions. The horizontal portions may be substantially perpendicular to the data line 171a; the vertical portions may be substantially parallel to the data line 171a. The first vertical portion may be directly connected to each of a first end (e.g., left end) of the first horizontal portion and a first end (e.g., left end) of the second horizontal portion without being directly connected to a first end (e.g., left end) of the third horizontal portion. The second vertical portion may be directly connected to each of a second end (e.g., right end) of the second horizontal portion and a second end (e.g., right end) of the third horizontal portion without being directly connected to a second end (e.g., right end) of the first horizontal portion. The third horizontal portion of the storage electrode line 132 may be connected to another layer and/or to an external driving circuit. The third horizontal portion of the storage electrode line 132 may also be the upper horizontal portion of the storage electrode line 131 of associated with a neighboring pixel disposed below the instant pixel.

A gate insulating layer 140 is formed on the gate conductor.

A first semiconductor 154a, a second semiconductor 154b, and a third semiconductor 154c are formed on the gate insulating layer 140.

Ohmic contacts may be formed on the semiconductors 154a, 154b, and 154c. Ohmic contacts 163a and 165a may be formed on the semiconductor 154a.

A data conductor may include data lines 171, 171a, 171b, and 171c, source electrodes (e.g., a first source electrode 175a), drain electrodes (e.g., a first drain electrode 175b), and a divided reference voltage line 172. The data conductor may be formed on the ohmic contacts and the gate insulating layer 140. The data conductor, the semiconductors positioned below the data conductor, and the ohmic contacts may be substantially simultaneously formed using one mask.

The data line 171 (which may be associated with the next unit pixel) and the data line 171a may have analogous configurations. Source electrodes, such as source electrodes 173a and 173c, may extend from data lines.

Drain electrodes, such as drain electrodes 175a and 175c, may extend from the divided reference voltage line 172.

The divided reference voltage line 172 may overlap a subpixel electrode 191a and may have a shape that is substantially similar to the shape of the number "5" or the number "2" shown in a seven-segment digital display. The divided reference voltage line 172 may include first, second, and third horizontal portions and may include first and second vertical portions. The horizontal portions may be substantially perpendicular to the data line 171a; the vertical portions may be substantially parallel to the data line 171a. The first vertical portion may be directly connected to each of a first end (e.g., left end) of the first horizontal portion and a first end (e.g., left end) of the second horizontal portion without being directly connected to a first end (e.g., left end) of the third horizontal portion. The second vertical portion may be directly connected each of a second end (e.g., right end) of the second horizontal portion and a second end (e.g., right end) of the third horizontal portion without being directly connected to a second end (e.g., right end) of the first horizontal portion.

In an embodiment, the divided reference voltage line 172 may have two portions each being shaped similar to the number "5" or "2" shown in a seven-segment digital display and respectively overlapping a subpixel electrode 191a and a subpixel electrode 191b.

In an embodiment, the length of the subpixel electrode 191b may be longer than the length of the subpixel pixel electrode 191a in a direction parallel to the data line 171, and the length of the portion of the divided reference voltage line 172 overlapping the subpixel electrode 191b may be longer than the length of the portion of the divided reference voltage line 172 overlapping the subpixel electrode 191a.

In an embodiment, the subpixel electrode 191b may be longer than the subpixel pixel electrode 191a in a direction parallel to the data line 171, and the storage electrode line 132 (which may overlap the subpixel electrode 191b) may be longer than the divided reference voltage line 172 (which may overlap the subpixel electrode 191a).

A gate electrode 124, the first source electrode 173a, the first drain electrode 175a, and the first semiconductor island 154a form a first thin film transistor (TFT) Qa, and a channel of the first thin film transistor Qa is formed in the semiconductor 154a between a first source electrode 173a and the first drain electrode 175a. Similarly, a gate electrode 124, the second source electrode 173b, the second drain electrode 175b, and the second semiconductor island 154b form a second thin film transistor Qb, and a channel of the second thin film transistor Qb is formed in the semiconductor 154b between a second source electrode 173b and a second drain electrode 175b. In addition, a gate electrode 124, a third source electrode 173c, the third drain electrode 175c, and the third semiconductor island 154c form a third thin film transistor Qc, and a channel of the third thin film transistor Qc is formed in the semiconductor 154c between the third source electrode 173c and the third drain electrode 175c.

The second drain electrode 175b is connected to the third source electrode 173c and includes a widely extended portion.

In an embodiment, the combination of one red pixel R, one green pixel G, and one blue pixel B may form one unit pixel. In one unit pixel, a data line 171a in the leftmost pixel (e.g., the red pixel R) may have a substantially straight line shape (without sections extending at substantial angles with respect to each other). The data line 171a may extend in a direction that is substantially perpendicular to a gate line 121.

The data line 171b may immediately neighbor subpixel electrodes 191a and 191b of each of the red pixel R and the green pixel G in the layout view of the display device. The data line 171c may immediately neighbor subpixel electrodes 191a and 191b of each of the green pixel G and the blue pixel B in the layout view of the display device. Each of line portions of the data line 171b and the data line 171c that overlap the first light blocking portion (which overlaps transistors of the display device) may have a bent structure, which may include two sections oriented (and/or extending) at an obtuse angle with respect to each other.

The data line 171b may include a first data line section, a second data line section, and a third data line section. The first data line section may overlap the first light blocking portion. The second data line section may not overlap the first light blocking portion (and may be positioned between the subpixel electrode 191a of the red pixel R and the subpixel electrode 191a of the green pixel G in the layout view of the display device). The third data line section may be connected between the first data line section and the second data line section. The third data line section may or may not overlap the first light blocking portion. The third data line section may extend at a first (obtuse) angle with respect to the first data line section and may extend at a second (obtuse) angle with respect to the second data line section. The first data line section may be positioned closer to the data line 171 (which is associated with the next unit pixel and overlapping the second light blocking portion) than the second data line section; i.e., the (minimum) distance between the first data line section and the data line 171 is smaller than the (minimum) distance between the second data line section and the data line 171.

The data line 171b may include a fourth data line section and a fifth data line section. The fifth data line section may not overlap the first light blocking portion (and may be positioned between the subpixel electrode 191b of the red pixel R and the subpixel electrode 191b of the green pixel G in the layout view of the display device). The fifth data line section may be connected between the first data line section and the fourth data line section. The fifth data line section may or may not overlap the first light blocking portion. The fifth data line section may extend at a third (obtuse) angle with respect to the first data line section and may extend at a fourth (obtuse) angle with respect to the fourth data line section.

The data line 171*c* may include a sixth data line section, a seventh data line section, and an eighth data line section. The sixth data line section may overlap the first light blocking portion. The seven data line section may not overlap the first light blocking portion (and may be positioned between the subpixel electrode 191*a* of the green pixel G and the subpixel electrode 191*a* of the blue pixel B in the layout view of the display device). The eighth data line section may be connected between the sixth data line section and the seventh data line section. The eighth data line section may or may not overlap the first light blocking portion. The eighth data line section may extend at a fifth (obtuse) angle with respect to the sixth data line section and may extend at a sixth (obtuse) angle with respect to the seventh data line section.

The data line 171*c* may include a ninth data line section and a tenth data line section. The ninth data line section may not overlap the first light blocking portion (and may be positioned between the subpixel electrode 191*b* of the green pixel G and the subpixel electrode 191*b* of the blue pixel B in the layout view of the display device). The tenth data line section may be connected between the sixth data line section and the ninth data line section. The tenth data line section may or may not overlap the first light blocking portion. The tenth data line section may extend at a seventh (obtuse) angle with respect to the sixth data line section and may extend at an eighth (obtuse) angle with respect to the ninth data line section.

The sixth data line section may be substantially parallel to the first data line section.

The bent structure of the data line 171*b* may require some components (e.g., transistor components) associated with the green pixel G to be positioned close to the data line 171*c* and the blue pixel B. For the components associated with the green pixel G to be sufficiently covered by the first light blocking portion with a reduced width B1, the bent structure of the data line 171*c* may protrude more than the bent structure of the data line 171*b*.

Therefore, the data line 171*c* and the data line 171*b* may have the following structural relations. The eighth data line section may be longer than the third data line section. The tenth data line section may be longer than the fifth data line section. A distance between the sixth data line section and the seventh data line section may be larger than a distance between the first data line section and the second data line section. The sixth data line section may be shorter than the first data line section (in a direction parallel to the data line 171*a*). The fifth obtuse angle may be equal to or smaller than the first obtuse angle. The sixth obtuse angle may be equal to or smaller than the second obtuse angle. The seventh obtuse angle may be equal to or smaller than the third obtuse angle. The eighth obtuse angle may be equal to or smaller than the fourth obtuse angle.

The bent structures of the data lines 171*b* and 171*c* may enable minimization of the width B1 of the first light blocking portion of the light blocking member 220 (while the required transistors are substantially accommodated in a corresponding area and substantially covered by the light blocking member 220). Therefore, an aperture ratio of the display device may be maximized. Advantageously, the display device may be able to provide satisfactory image display quality and/or power efficiency.

A first passivation layer 180*p* is formed on the data conductor and previously-exposed portions of semiconductors 154*a*, 154*b*, and 154*c*. The first passivation layer 180*p* may include an inorganic insulating layer, such as a silicon nitride layer or a silicon oxide layer. In an embodiment, a second passivation layer 180*q* may include a color filter, and the first passivation layer 180*p* can prevent a pigment of the color filter from flowing into the semiconductors 154*a*, 154*b*, and 154*c*.

A second passivation layer 180*q* may be provided on the first passivation layer 180*p* or may be omitted. The second passivation layer 180*q* may be or may include one or more color filters. The one or more color filters may display one or more of primary colors. The primary colors may include red, green, and blue or may include yellow, cyan, and magenta. The one or more color filters may include a color filter configured for displaying a mixed color of primary colors. The one or more color filters may include a color filter configured for displaying white.

A first contact hole 185*a* and a second contact hole 185*b* configured for exposing the first drain electrode 175*a* and the second drain electrode 175*b* are formed in the first passivation layer 180*p* and the second passivation layer 180*q*.

A plurality of pixel electrodes 191 are formed on the second passivation layer 180*q*. Each pixel electrode 191 may include a first subpixel electrode 191*a* and a second subpixel electrode 191*b* neighboring each other in a column direction (parallel to the data line 171*a*), with a gate electrode 121 extending between the subpixels 191*a* and 191*b*. The pixel electrode 191 may be made of a transparent material, such ITO and/or IZO. Alternatively or additionally, the pixel electrode 191 may be made of a reflective metal, such as aluminum, silver, chromium, or an alloy of some of the materials.

A shielding electrode 273 made of the same material as the pixel electrode 191 may be formed in the same layer as the pixel electrode 191 on the second passivation layer 180*q*. The pixel electrode 191 and the shielding electrode 273 may be simultaneously formed through the same process.

The shielding electrode 273 may include a vertical portion overlapping an edge portion and/or a center portion of a data line (e.g., a data line 171, 171*a*, 171*b*, or 171*c*). The shielding electrode may include one or more horizontal portions 275 connecting neighboring vertical portions. The horizontal portion of the shielding electrode may have an expended portion in the middle thereof.

A voltage applied to a common electrode 270 may be also applied to the shielding electrode 273. Thus, substantially no electric field may be generated between the shielding electrode 273 and the common electrode 270, such that a portion of the liquid crystal layer 3 positioned between the shielding electrode 273 and the common electrode 270 may remain unchanged. Accordingly, a portion of the display device corresponding to the portion of the liquid crystal layer may display black. The portion of the liquid crystal layer may serve as a black matrix. Thus, a black matrix typically provided in an upper panel may be omitted in a liquid crystal display device according to an embodiment of the present invention.

In an embodiment, a black matrix may be additionally provided.

A first subpixel electrode 191*a* may include horizontal stems extending in a horizontal direction and may include a plurality of minute branches extending in an oblique and/or diagonal direction at lateral sides of the horizontal stem portions. Two horizontal stems 193*a* and 193*b* may exist in the first subpixel electrode 191a, and extending directions of minute branches associated with the two horizontal stems may be different.

The subpixel electrode 191a may include a first vertical stem that may extend perpendicularly and may be directly connected to the right end of the first horizontal stem 193a, and a minute branch extending from the first horizontal stem 193a may extend obliquely in a direction away from the first vertical stem.

The subpixel electrode 191a may include a second vertical stem that may extend perpendicularly and may be directly connected to the left end of the second horizontal stem 193b, and a minute branch extending from the second horizontal stem 193b may extend obliquely in a direction away from the second vertical stem.

In an embodiment, the left end of the first horizontal stem may be directly connected to a first vertical stem, and the right end of the second horizontal stem may be directly connected to a second vertical stem.

One or more of the minute branches extending from the first horizontal stem may be directly connected to an extended portion of the first subpixel electrode 191a and may receive a voltage from a drain electrode 175a through the first contact hole 185a.

The shape or configuration of a second subpixel 191b may be analogous to that of the first subpixel electrode 191a. That is, the second subpixel electrode 191b may include two horizontal stems extending in a horizontal direction and a plurality of minute branches extended in an oblique and/or diagonal direction from lateral sides of each of the horizontal stems. Two horizontal stems may exist in the second subpixel electrode 191b, and minute branches associated with the two horizontal stems may extend in different directions.

A divided reference voltage line 172 may not substantially overlap and may overlap only edges of minute branches of a corresponding pixel electrode 191.

A first horizontal portion of the divided reference voltage line 172, which is located at the upper end of the divided reference voltage line 172, may overlap edges of some minute branches of the first subpixel electrode 191a.

A first vertical portion, which is directly connected to the first horizontal portion of the divided reference voltage line 172 and is located at the left side of the divided reference voltage line 172, may overlap the second vertical stem of the first subpixel electrode 191a.

A second horizontal portion of the divided reference voltage line 172, which is directly connected to the first vertical portion of the divided reference voltage line 172 and is substantially located at a middle portion of the divided reference line 172, may be located between the minute branches extending from the first horizontal stem and the minute branches extending from the second horizontal stem in the layout view of the display device.

The second vertical portion of the divided reference voltage line 172, which is directly connected to the second horizontal portion of the divided reference voltage line 172 and located at the right side of the divided reference voltage line 172, may overlap the first vertical stem of the first subpixel electrode 191a.

The third horizontal portion 177 of the divided reference voltage line 172, which is directly connected to the second vertical portion of the divided reference voltage line 172, may overlap edges of some minute branches extending from the first horizontal stem 193a of the first subpixel electrode 191a.

The structural relations between a storage electrode line 132 or a portion of the divided reference voltage line 172 and a second subpixel electrode 191b may be analogous to the previously-discussed structural relations between the divided reference voltage line 172 and the first subpixel electrode 191a.

The first subpixel electrode 191a and the second subpixel electrode 191b are physically and electrically connected to the first drain electrode 175a and the second drain electrode 175b through the first contact hole 185a and the second contact hole 185b, respectively, and may receive a data voltage from the first drain electrode 175a and the second drain electrode 175b. A part of the data voltage applied to the second drain electrode 175b may be divided by the third source electrode 173c, such that the voltage applied to the first subpixel electrode 191a may become higher than the voltage applied to the second subpixel electrode 191b.

A light blocking member 220 is formed on an insulation substrate 210 made of transparent glass or plastic. The light blocking member 220 may be a black matrix and may prevent light leakage. The light blocking member 220 may include the previously-described first, second, third, and fourth light blocking portions.

A plurality of color filters 230 are formed on the substrate 210. In an embodiment, the second passivation layer 180q may include one or more color filters, and the color filters 230 may be omitted. In an embodiment, the light blocking member 220 may be positioned closer to the substrate 110 than the substrate 210.

A color filter 230 with a designated color may be provided for each pixel of one unit pixel. In the display device according to an embodiment of the present invention, a red color filter may be formed in the red pixel R, a green color filter may be formed in the green pixel G, and a blue color filter may be formed in the blue pixel B.

An overcoat 250 is formed on the color filter 230 and the light blocking member 220. The overcoat 250 may be made of an (organic) insulation material, may prevent the color filters 230 from being exposed, and may provide a flat surface. In an embodiment, the overcoat 250 can be omitted.

A common electrode 270 is formed on the overcoat. An upper alignment layer (not illustrated) may be formed on the common electrode 270. The upper alignment layer may be a vertical alignment layer.

A liquid crystal layer 3 may be provided between substrates 110 and 201 and may have negative dielectric anisotropy. Liquid crystal molecules of the liquid crystal layer 3 may be oriented so that long axes of the liquid crystal molecules may be perpendicular to the surfaces of the two substrates 110 and 210 when no electric field is applied to the liquid crystal layer 3.

A first subpixel electrode 191a and a second subpixel electrode 191b applied with a data voltage may generate an electric field together with the common electrode 270, such that orientations of the liquid crystal molecules of the liquid crystal layer 3 between the two electrodes 191 and 270 may be controlled. According to the orientations of the liquid crystal molecules, luminance of light passing through the liquid crystal layer 3 may be changed.

Figure 4:
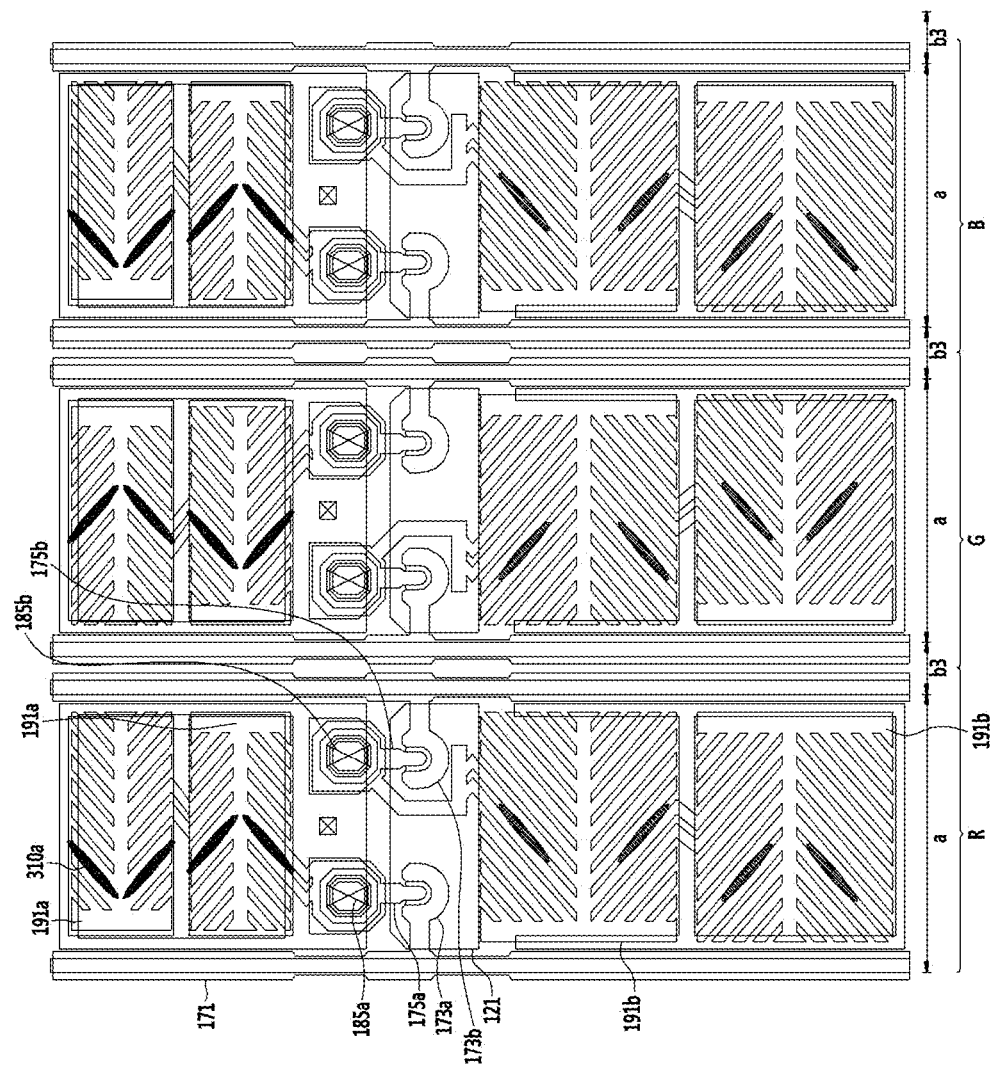
FIG. 4 is a schematic layout view illustrating a liquid crystal display and alignment directions of liquid crystal molecules according to an embodiment of the present invention.

FIG. 4 is a schematic layout view illustrating a liquid crystal display and alignment directions (i.e., orientations) of liquid crystal molecules according to an embodiment of the present invention. Referring to FIG. 4, the data lines 171 may not have bent structures in transistor regions overlapped by a first light blocking portion of a light blocking member.

Each of second, third, and fourth light blocking portions of the light blocking member may have a width b3 in a direction perpendicular to a data line 171 and may be positioned between pixel electrodes immediately neighboring each other in the direction in the layout view of the liquid crystal display.

Referring to FIG. 4, liquid crystal molecules 310*a* in neighboring pixels are aligned in opposite directions. For example, in the uppermost area corresponding to a first subpixel electrode, liquid crystal molecules 310*a* are oriented to have a "<" shape arrangement in the red pixel R, liquid crystal molecules are oriented to have a ">" shape arrangement in the green pixel G, and liquid crystal molecules are oriented to have a "<" shape arrangement in the blue pixel B.

Thus, liquid crystal molecules may be arranged in the shape of "<><" at the upper portion of a unit pixel of the liquid crystal display.

In an embodiment, the liquid crystal display may have a curved structure, and misalignment may occur due to a curvature difference between upper and lower substrates. Given the substrate misalignment, one or more of the second, third, and fourth light blocking portions may be misaligned, and an unwanted texture may appear at a boundary between pixels.

Figure 5:
FIG. 5 illustrates an image displayed by a liquid crystal display and showing a reverse directional texture according to an embodiment of the present invention.

FIG. 5 illustrates an image displayed by a (curved) liquid crystal display and showing a reverse directional texture according to an embodiment of the present invention. In the curved display, a misalignment of a light blocking portion may occur at a boundary between two immediately neighboring pixels, such that light may pass through liquid crystals aligned in the reverse direction. As a result, a reverse directional texture may appear in the image.

Figure 6:
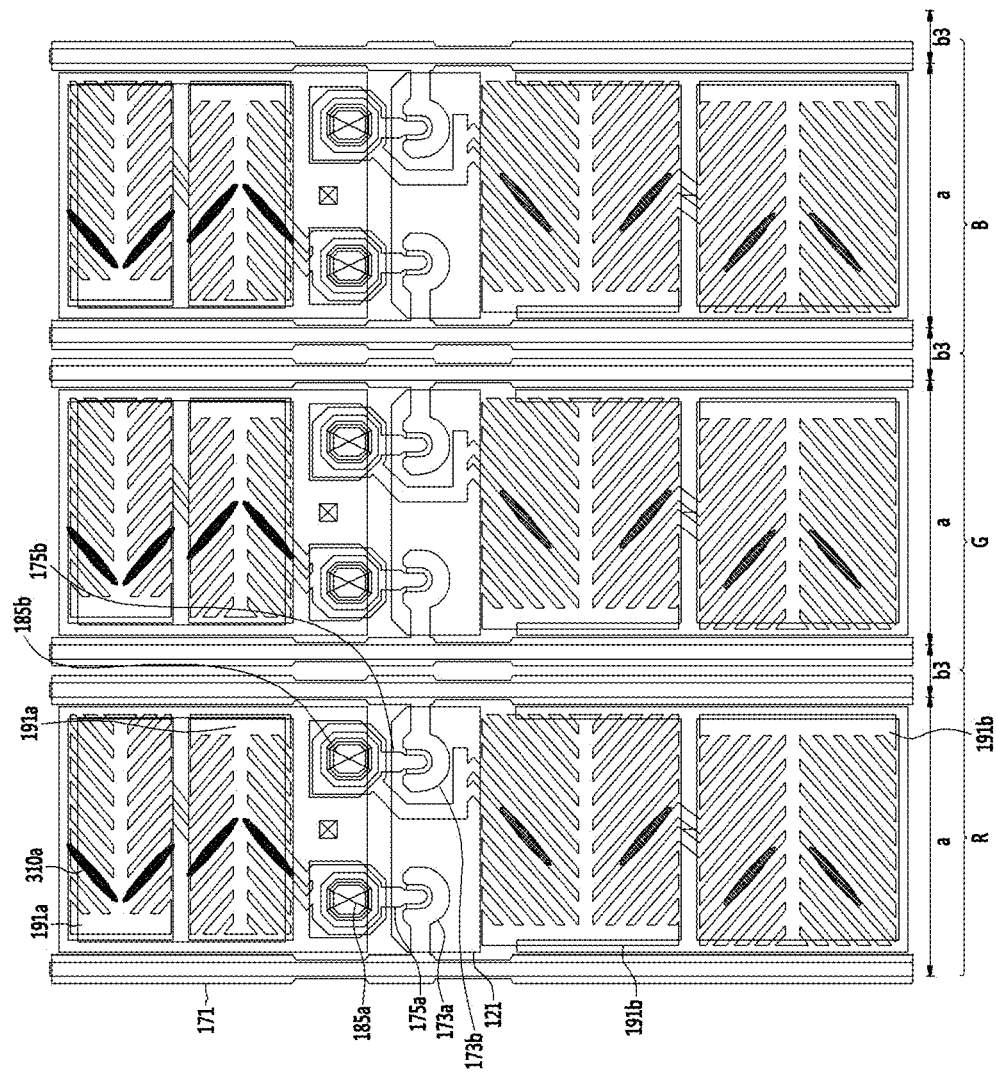
FIG. 6 is a schematic layout view illustrating a liquid crystal display and alignment directions of liquid crystal molecules according to an embodiment of the present invention.

FIG. 6 is a schematic layout view illustrating a liquid crystal display and alignment directions of liquid crystal molecules according to an embodiment of the present invention. The liquid crystal display illustrated in FIG. 6 may be similar to the liquid crystal display illustrated in FIG. 4 in the structures of the pixels R and B. The pixel G structure illustrated in FIG. 6 may substantially be a mirror image of the pixel G structure illustrated in FIG. 4. Liquid crystal molecules of three adjacent pixels (in the same unit pixel) may be aligned according to the same arrangement in the liquid crystal display illustrated in FIG. 6. For example, at the upper portion of the liquid crystal display, the liquid crystal molecules 310*a* of the red pixel R are oriented to have a "<" shape arrangement, the liquid crystal molecules of the green pixel G are oriented to have a "<" shape arrangement, and the liquid crystal molecules of the blue pixel B are oriented to have a "<" shape arrangement.

Thus, liquid crystal molecules of the three adjacent pixels may be arranged are aligned in the shape of "<<<" at the upper portion of a unit pixel of the liquid crystal display.

The three adjacent pixels may form one unit pixel, alignment direction arrangements of liquid crystal molecules in the three pixels may be the same in each unit pixel in the liquid crystal display illustrated in FIG. 6. Since the liquid crystal molecules are aligned according to the same arrangement in the respective pixels R, G, and B of one unit pixel, substrate misalignment may not result in significant texture in a unit pixel in a displayed image.

In an embodiment, alignment direction arrangements of liquid crystal molecules may be different for two immediately neighboring unit pixels. For example, the liquid crystal molecules of the six adjacent pixels of the two unit pixels may be aligned according to the arrangements of "<<<>>>".

Since two neighboring unit pixels may have different alignment direction arrangements of liquid crystal molecules, a wide light blocking portion corresponding to the boundary of the two neighboring unit pixels may be required to prevent display of a texture in an image.

Figure 7:
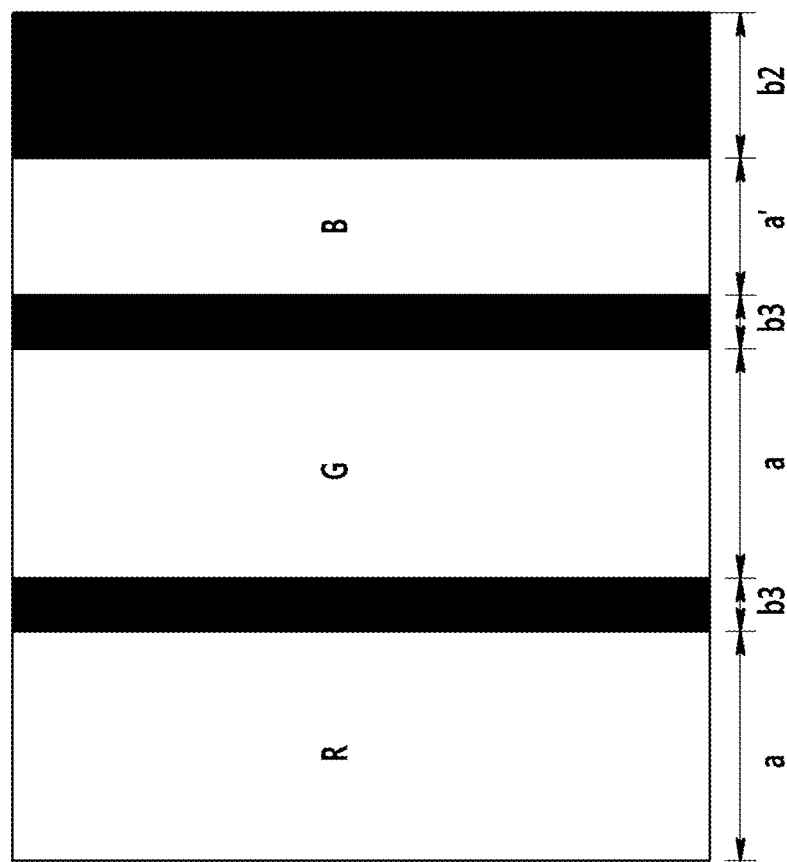
FIG. 7 is a schematic diagram (e.g., a schematic top view) illustrating pixel areas and light blocking areas in a display device (e.g., the display illustrated in FIG. 6) according to an embodiment of the present invention.

FIG. 7 is a schematic diagram (e.g., a schematic top view) illustrating pixel areas (not covered by a light blocking member and each having a width a or a') and light blocking areas (covered by light blocking portions and each having a width b3 or b2 according to the corresponding light blocking portion) in a display device, such as a display device having features discussed with reference to one or more of FIGS. 1 to 6, according to an embodiment of the present invention. A width b2 of a light blocking area between adjacent unit pixels may be larger than a width b3 of a light blocking area b3 between immediately neighboring pixels in the unit pixel. The light blocking area (and the corresponding vertical light blocking portion) with the enlarged b2 may prevent the texture discussed with reference to FIG. 6 from being displayed.

For enlarging b2, a width of a pixel area of the blue pixel B may be reduced to a', which may be less than the width a of the pixel area of each of the red pixel R and the green pixel G. The sum of the width a and the width b3 may be equal to the sum of the width a' and the width b2. As a result, the blue pixel B may have a lower aperture ratio and therefore lower light transmittance than other pixels.

Figure 8:
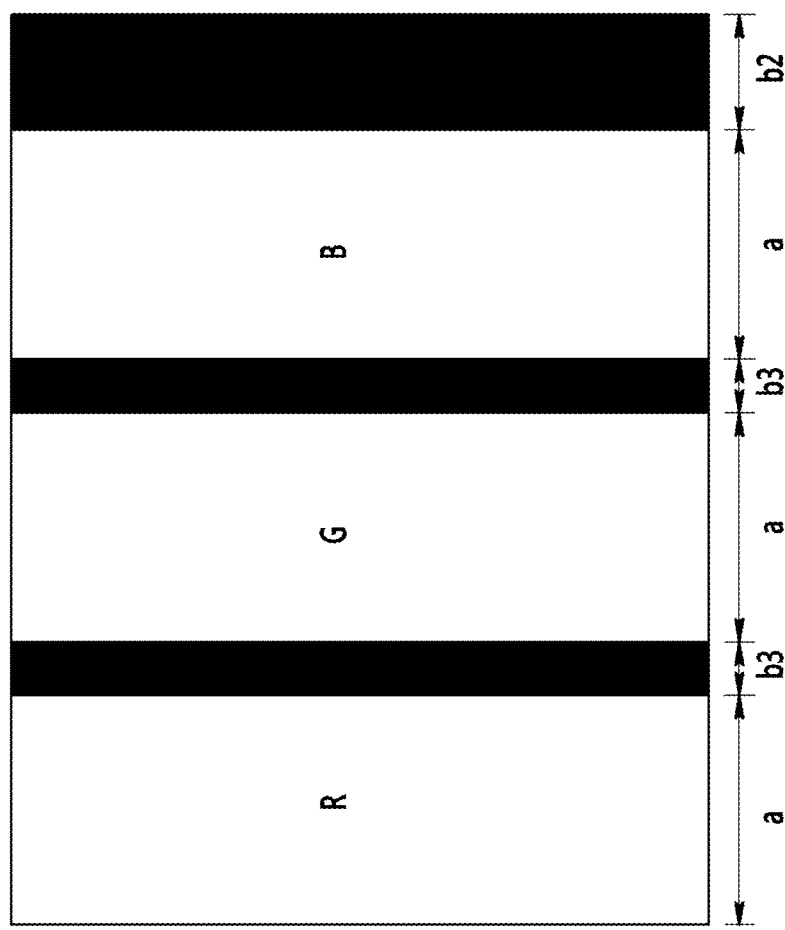
FIG. 8 is a schematic diagram (e.g., a schematic top view) illustrating pixel areas and light blocking areas in a display device (e.g., the display illustrated in FIG. 6) according to an embodiment of the present invention.

FIG. 8 is a schematic diagram (e.g., a schematic top view) illustrating pixel areas (not covered by a light blocking member and each having a width a) and light blocking areas (covered by the light blocking member and each having a width b3 or b2 according to the corresponding vertical light blocking portion) in a display device, such as a display device having features discussed with reference to one or more of FIGS. 1 to 6, according to an embodiment of the present invention. Referring to FIG. 8, the width a of a pixel area of the blue pixel B may be equal to the width a of the pixel area of each of the red pixel R and the green pixel G. The enlarged width b2 of the light blocking area between the blue pixel B and the next unit pixel may prevent unwanted texture from being displayed. The sum of the width a and the width b3 may be less than the sum of the width a and the width b2.

In an liquid crystal display according to an embodiment of the present invention, bent structures of data lines may enable minimization of the width of a horizontal light blocking area (i.e., a first light blocking portion discussed with reference to FIG. 1) in a transistor region, for compensating potential light transmission loss (or potential aperture ratio loss) caused by enlargement of b2. Given that data line have bent structures in the transistor region, transistor parts of the respective pixels may be shoved to the right side. A vertical light blocking area having a wide width b2 may be provided next to the blue pixel B and may accommodate the shoved transistor parts, such that the shoved transistor parts may not intrude into the adjacent/next unit pixel.

That is, a part of the wide vertical light blocking area next to the blue pixel B may be used as a transistor region, such that the width of the horizontal light blocking area may be minimized, and the aperture ratio and/or light transmittance of the display device may be maximized.

Figure 9:
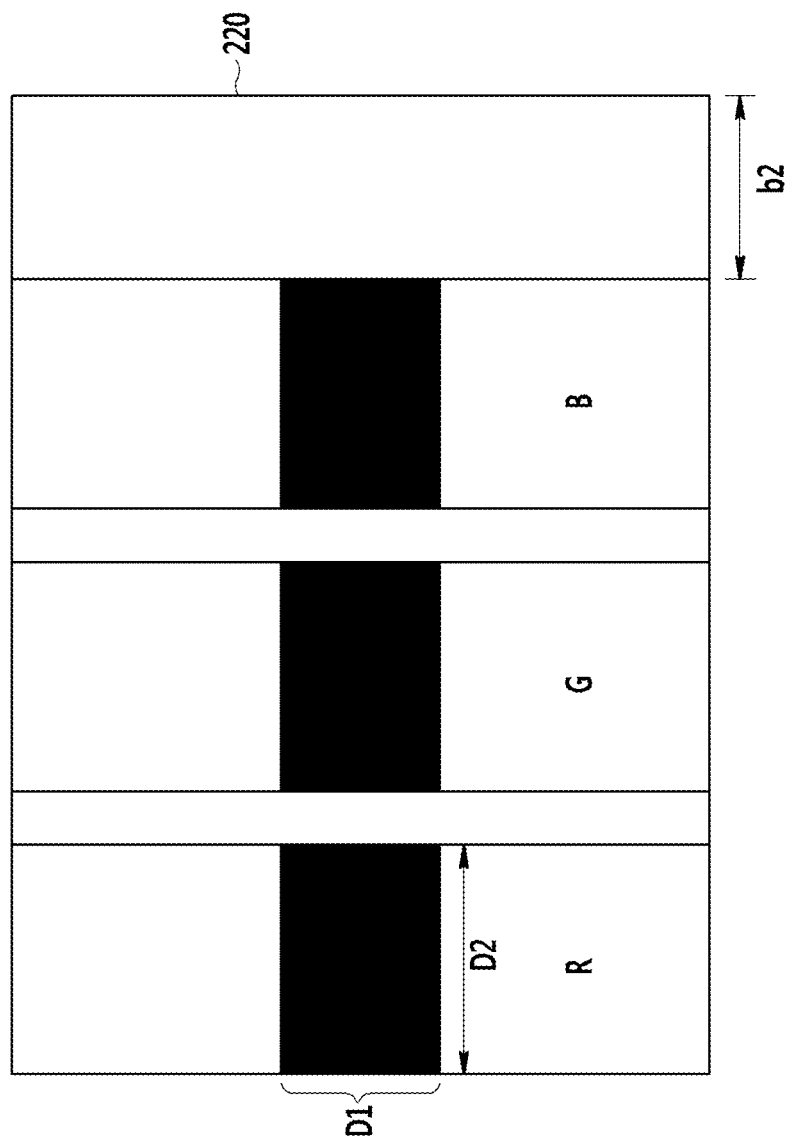
FIG. 9 is a schematic diagram (e.g., a schematic top view) illustrating locations of transistor regions in a display device according to an embodiment of the present invention.
Figure 10:
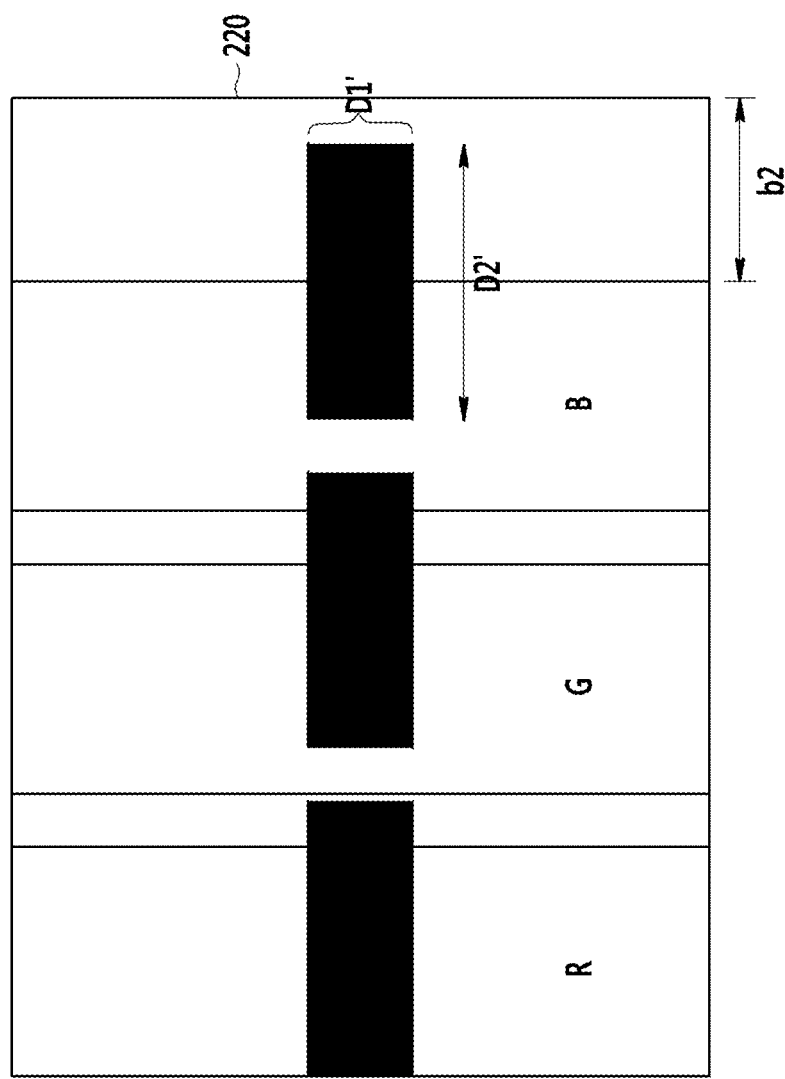
FIG. 10 is a schematic diagram (e.g., a schematic top view) illustrating locations of transistor regions in a display device according to an embodiment of the present invention.

FIG. 9 and FIG. 10 schematically illustrate effects discussed with reference to FIG. 1 and FIG. 8. FIG. 9 is a schematic diagram (e.g., a schematic top view) illustrating a locations of transistor regions in a display device according to an embodiment of the present invention. FIG. 10 is a schematic diagram (e.g., a schematic top view) illustrating locations of transistor regions in a display device according to an embodiment of the present invention.

Referring to FIG. 9, a transistor region of each pixel may exist in each pixel and may not protrude into a vertical light blocking area.

Referring to FIG. 10, a transistor region of each pixel may be shoved to the right side in each pixel and may protrude into a vertical light blocking area.

In FIG. 9 and FIG. 10, the areas of transistor regions may be equal to one another. That is, the area D1×D2 may be equal to the area D1'×D2'. Each of the transistor regions may be covered by a light blocking member and may have a sufficient area for accommodating the corresponding transistor parts.

Referring to FIG. 10 and FIG. 9, D2' is greater than D2, and D1' may be smaller than D1. Although the vertical width of the transistor regions is decreased, the same area of the transistor regions can be maintained for sufficiently accommodating transistor parts. Since the vertical width of the transistor regions can be reduced, the entire aperture ratio and transmittance of the pixels can be improved. In order to shove the transistor regions to the right side for reducing the vertical width of the transistor regions, data lines of a liquid crystal display according to an embodiment of the present invention may have bent structures described above.

In a liquid crystal display according to an embodiment of the present invention, the horizontal widths of each of the three pixels are equal to one another so that color distortion may be prevented. In an embodiment, liquid crystal alignment direction arrangements are the same for the pixels R, G, and B in one unit pixel, and thus no significant reverse directional texture may be displayed. Data lines in each unit pixel may have bent structures to reduce the total area of the light blocking member, thereby improving the aperture ratio.

Figure 11:
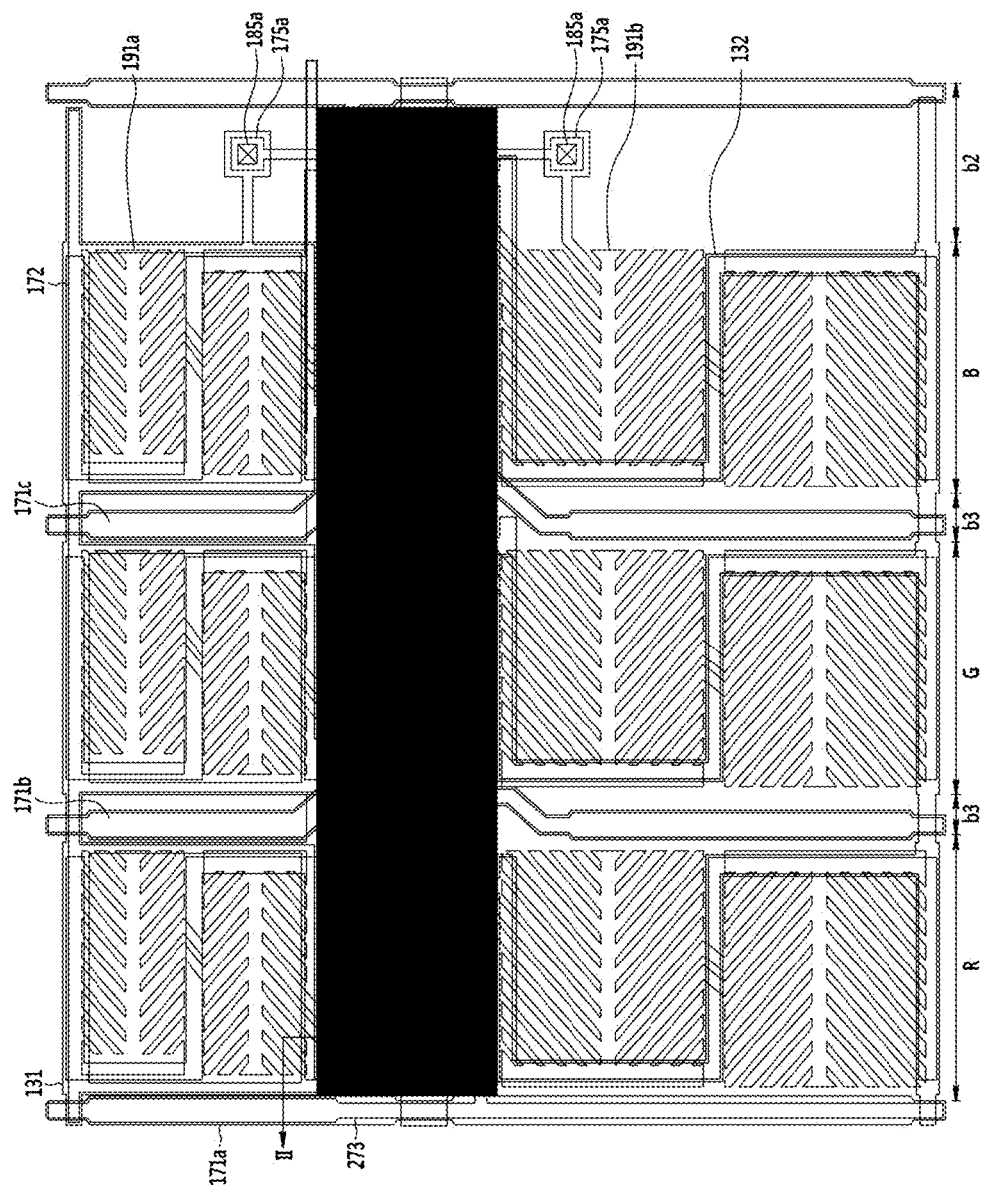
FIG. 11 is a schematic layout view illustrating a liquid crystal display according to an embodiment of the present invention.

FIG. 11 is a schematic layout view illustrating a liquid crystal display according to an embodiment of the present invention. The liquid crystal display may have one or more features and/or advantages discussed with reference to one or more of FIGS. 1 to 10. Referring to FIG. 11, in the liquid crystal display, a contact hole 185a through which a portion of the subpixel electrode 191a of the blue pixel B and a portion of a drain electrode 175a of the blue pixel B directly contact each other may be formed in a first (e.g., upper) light blocking area that overlaps a first (e.g., upper) light blocking section of the second light blocking portion of the light blocking member 220 (illustrated in FIG. 2); another contact hole 185a through which a portion of the subpixel electrode 191b of the blue pixel B and a portion of another drain electrode 175a of the blue pixel B directly contact each other may be formed in a second (e.g., lower) light blocking area that overlaps a second (e.g., lower) light blocking section of the second light blocking portion of the light blocking member 220 (illustrated in FIG. 2).

A light blocking section of the first light blocking portion of the light blocking member 220 may be positioned between the first and second light blocking sections of the second light blocking portion. The (minimum) distance between the first data line section of the data line 171b and the light blocking section of the first light blocking portion may be smaller than the (minimum) distance between the second data line section of the data line 171b and the first light blocking section of the second light blocking portion in a direction perpendicular to the second data line section of the data line 171b.

The contact holes 185a may not occupy a space between the subpixel electrodes 191a and 191b. Therefore, the vertical width B1 of the first light blocking portion may be minimized Advantageously, an aperture ratio of the liquid crystal display may be maximized.

While embodiments of this invention have been described, the invention is not limited to the described embodiments. This invention is intended to cover various modifications and equivalent arrangements included within the spirit and scope defined by the appended claims.

What is claimed is:

1. A display device comprising:
    a first transistor, which includes a first transistor electrode and a second transistor electrode;
    a first pixel electrode, which is electrically connected to the second transistor electrode;
    a first data line, which is electrically connected to the first transistor electrode, wherein the first data line includes a first bent structure; and
    a light blocking member, which includes a first light blocking portion, wherein the first light blocking portion extends perpendicular to a section of the first data line, and wherein the first light blocking portion overlaps both the first transistor and the first bent structure without overlapping the section of first data line in a direction perpendicular to the light blocking member.

2. The display device of claim 1, further comprising a second data line,
    wherein the light blocking member includes a second light blocking portion, which extends parallel to the section of the first data line and overlaps the second data line,
    wherein the light blocking member includes a third light blocking portion, which extends parallel to the section of the first data line and is connected to the second light blocking portion through the first light blocking portion,
    wherein the second light blocking portion is wider than the third light blocking portion in a direction perpendicular to the section of the first data line, and
    wherein the first bent structure protrudes toward the second data line.

3. The display device of claim 2, further comprising a second transistor,
    wherein a portion of the second transistor directly contacts a first portion of the first pixel electrode, and
    wherein the portion of the second transistor overlaps the second light blocking portion without overlapping the first light blocking portion in the direction perpendicular to the light blocking member.

4. The display device of claim 3, further comprising a third transistor,
    wherein a portion of the third transistor directly contacts a second portion of the first pixel electrode,
    wherein the portion of the third transistor overlaps the second light blocking portion without overlapping the first light blocking portion in the direction perpendicular to the light blocking member, and
    wherein the first light blocking portion is positioned between the portion of the second transistor and the portion of the third transistor in a layout view of the display device.

5. The display device of claim 2, wherein a width of the second light blocking portion is at least two times a width of the third light blocking portion.

6. The display device of claim 1, further comprising:
    a second data line, which extends parallel to the section of the first data line; and
    a third data line, which is positioned between the first data line and the second data line,
    wherein the third data line includes a second bent structure, and wherein the first light blocking portion overlaps the second bent structure.

7. The display device of claim 6, wherein each of the first bent structure and the second bent structure protrudes toward the second data line, and wherein the second bent structure protrudes more significantly than the first bent structure.

8. The display device of claim 6, further comprising a second pixel electrode, which is spaced from the first pixel electrode,
wherein the first bent structure is not positioned between two subpixel electrodes of any pixel electrode of the display device in a layout view of the display device, and
wherein a portion of the second bent structure is positioned between a first subpixel electrode of the second pixel electrode and a second subpixel electrode of the second pixel electrode in the layout view of the display device.

9. The display device of claim 1, wherein a portion of the first bent structure is positioned between a first subpixel electrode of the first pixel electrode and a second subpixel electrode of the first pixel electrode in a layout view of the display device.

10. The display device of claim 1, further comprising:
a second pixel electrode, which neighbors the first pixel electrode without any pixel electrode being positioned between the first pixel electrode and the second pixel electrode;
a third pixel electrode, which neighbors the second pixel electrode with no pixel electrode being positioned between the second pixel electrode and the third pixel electrode,
a first-color color filter, which overlaps the first pixel electrode;
a second-color color filter, which overlaps the second pixel electrode;
a third-color color filter, which overlaps the third pixel electrode,
wherein a width of the first pixel electrode is equal to each of a width of the second pixel electrode and a width of the third pixel electrode.

11. The display device of claim 10, wherein a branch electrode structure of the first pixel electrode is identical to each of a branch electrode structure of the second pixel electrode and a branch electrode structure of the third pixel electrode.

12. The display device of claim 11, wherein each of the branch electrode structure of the first pixel electrode, the branch electrode structure of the second pixel electrode, and the branch electrode structure of the third pixel electrode includes a "<" shaped structure and a ">" shaped structure that are connected to each other in a direction parallel to the section of the first data line.

13. The display device of claim 1,
wherein the first data line includes a first data line section, a second data line section, and a third data line section,
wherein the first bent structure includes the first data line section and the third data line section,
wherein the section of the first data line is the second data line section,
wherein the first data line section is not aligned with the second data line section,
wherein the first data line section is connected through the third data line section to the second data line section, and
wherein the first light blocking portion overlaps the first data line section without overlapping the second data line section in the direction perpendicular to the light blocking member.

14. The display device of claim 13, wherein the third data line section extends at an obtuse angle with respect to the first data line section.

15. The display device of claim 13, wherein the second data line section extends in a direction parallel to the first data line section.

16. The display device of claim 13, further comprising a second data line,
wherein the light blocking member includes a second light blocking portion, which extends parallel to the second data line section and overlaps the second data line,
wherein the light blocking member includes a third light blocking portion, which extends parallel to the second data line section and is connected to the second light blocking portion through the first light blocking portion,
wherein the second light blocking portion is wider than the third light blocking portion in a direction perpendicular to the second data line section, and
wherein the first data line section is positioned closer to the second data line than the second data line section.

17. The display device of claim 16, further comprising a third data line, which is positioned between the first data line and the second data line,
wherein the third data line includes a fourth data line section, a fifth data line section, and a sixth data line section,
wherein the fourth data line section is not aligned with the fifth data line section,
wherein the fourth data line section is connected through the sixth data line section to the fifth data line section,
wherein the first light blocking portion overlaps the fourth data line section without overlapping the fifth data line section in the direction perpendicular to the light blocking member, and
wherein the sixth data line section is longer than the third data line section.

18. The display device of claim 17, wherein an obtuse angle formed between the fourth data line section and the sixth data line section is smaller than an obtuse angle formed between the first data line section and the third data line section.

19. The display device of claim 17, wherein the fourth data line section is shorter than the first data line section.

20. The display device of claim 17, wherein the first light blocking portion overlaps the sixth data line section without overlapping the third data line section.

* * * * *